(12) United States Patent
Bessho et al.

(10) Patent No.: US 7,515,501 B2
(45) Date of Patent: Apr. 7, 2009

(54) MEMORY ARCHITECTURE HAVING LOCAL COLUMN SELECT LINES

(75) Inventors: Shinji Bessho, Tsukuba (JP); Takumi Nasu, Tsuchiura (JP); Takuya Nakanishi, Tsukuba (JP); Koichiro Ito, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/807,272

(22) Filed: May 24, 2007

(65) Prior Publication Data

US 2008/0291766 A1 Nov. 27, 2008

(51) Int. Cl.
*G11C 8/00* (2006.01)
(52) U.S. Cl. ............... 365/230.03; 365/63; 365/230.06
(58) Field of Classification Search .................. 365/63, 365/230.03, 230.06
See application file for complete search history.

(56) References Cited

U.S. PATENT DOCUMENTS

| | | | | |
|---|---|---|---|---|
| 5,331,593 | A | * 7/1994 | Merritt et al. | 365/189.11 |
| 6,097,648 | A | 8/2000 | Bessho et al. | 365/203 |
| 6,459,627 | B1 | * 10/2002 | Sakamoto et al. | 365/190 |
| 6,542,428 | B2 | * 4/2003 | Hidaka | 365/230.03 |
| 6,850,452 | B2 | 2/2005 | Keeth et al. | 365/226 |
| 2008/0080291 | A1 | 4/2008 | Ha | 365/230.06 |

* cited by examiner

*Primary Examiner*—Hoai V Ho
(74) *Attorney, Agent, or Firm*—Dorsey & Whitney LLP

(57) ABSTRACT

A memory architecture for an array of memory cells having a plurality of sections of memory and a plurality of regions disposed between the plurality of sections of memory. Each section of memory having a plurality of memory cells arranged in rows and columns of memory and a plurality of sense amplifiers located in each of the plurality of regions. The sense amplifiers coupled to a respective column of memory. A plurality of column select lines are located in each of the plurality of regions with each column select line coupled to a group of column select switches associated with a section of memory to activate the respective column select switches.

26 Claims, 6 Drawing Sheets

MEMORY ARCHITECTURE HAVING LOCAL COLUMN SELECT LINES

TECHNICAL FIELD

The present invention relates generally to integrated circuit memory systems, and more particularly, to memory systems including an array of memory having column select lines coupled to column select gates associated with one section of memory.

BACKGROUND OF THE INVENTION

Memory systems in electronic systems are typically used to store data for retrieval at a later time. Memory systems come in different types of memory. For example, one type of memory is a "volatile" memory, which can store data only when supplied with power. Volatile memory systems are typically designed as dynamic random access memory (DRAM) or static random access memory (SRAM) systems, each having different memory cell configurations. These types of memory systems are often used in computer systems and other processor-based systems for storing data used during processing. Another type of memory system is a "non-volatile" memory system, which can store data even when power is not supplied. There are different designs for non-volatile memory, including NAND-type flash memory and NOR-type flash memory, each having a different memory cell arrangement and manner of accessing data stored by the memory cells. Non-volatile memory systems are used in applications where data should be continuously stored, even when the electronic system including the non-volatile memory is switched off. Cellular phones, digital cameras, personal digital assistants, digital music players, are some examples of where non-volatile memory systems are used.

Memory systems can also be implemented in different forms. For example, a memory system can be implemented as an individual memory device. Individual memory devices can be electrically coupled and mounted together on a common substrate to form a memory module, which is then coupled to an electronic system, such as a computer system. Individual memory devices can also be electrically coupled and mounted to a substrate on which other components of an electronic system are also mounted. Memory systems can also be "embedded" in an electronic system. That is, the memory system is formed on a common semiconductor with other electrical circuitry of an electrical system. As illustrated by the previous discussion, memory systems come in different types and arrangements, and are used in a wide range of electronic systems.

It is generally desirable for a memory system to have fast access times. That is, the less time required to retrieve data from the memory system, the more desirable the memory system. One approach taken to reduce access times of a memory system is to more precisely control internal operation and timing of memory circuitry, such as controlling when signals are driven onto signal lines and when circuitry is activated and deactivated. By precisely controlling the timing and operation, the memory system can provide data from requested memory locations in the least amount of time while still including sufficient timing margin to allow for variations in manufacture and operating conditions that may affect performance of the memory system. However, as with many electrical systems, physical limitations limit the degree of precision for controlling operation of the memory system. One example is electrical loading of a signal line. As known, electrical loading is generally greater for longer signal lines. Electrical loading is also affected by the number of circuit elements coupled to the signal line. Where a signal is propagated over a relatively long signal line, or a signal line that is coupled to many circuit elements, the deterioration of signal response and resulting delay in a signal driven onto the signal line must be taken into account. Typically, the "worst case" timing is used as the basis for determining operation and internal timing of the memory system. Using the worst case timing results in an access time that is typically greater than what could be achieved with more precise control over internal operation and timing. It is also generally desirable for a memory system to have low power consumption and small form factor. These factors often compete with one another, and the resulting design of a memory system is a compromise of the various considerations.

Therefore, there is a need for alternative approaches in memory array architecture that provide more precise control over internal operation and timing, while also reducing power consumption and layout size of memory systems without compromising memory system performance.

DETAILED DESCRIPTION OF PREFERRED EMBODIMENTS

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
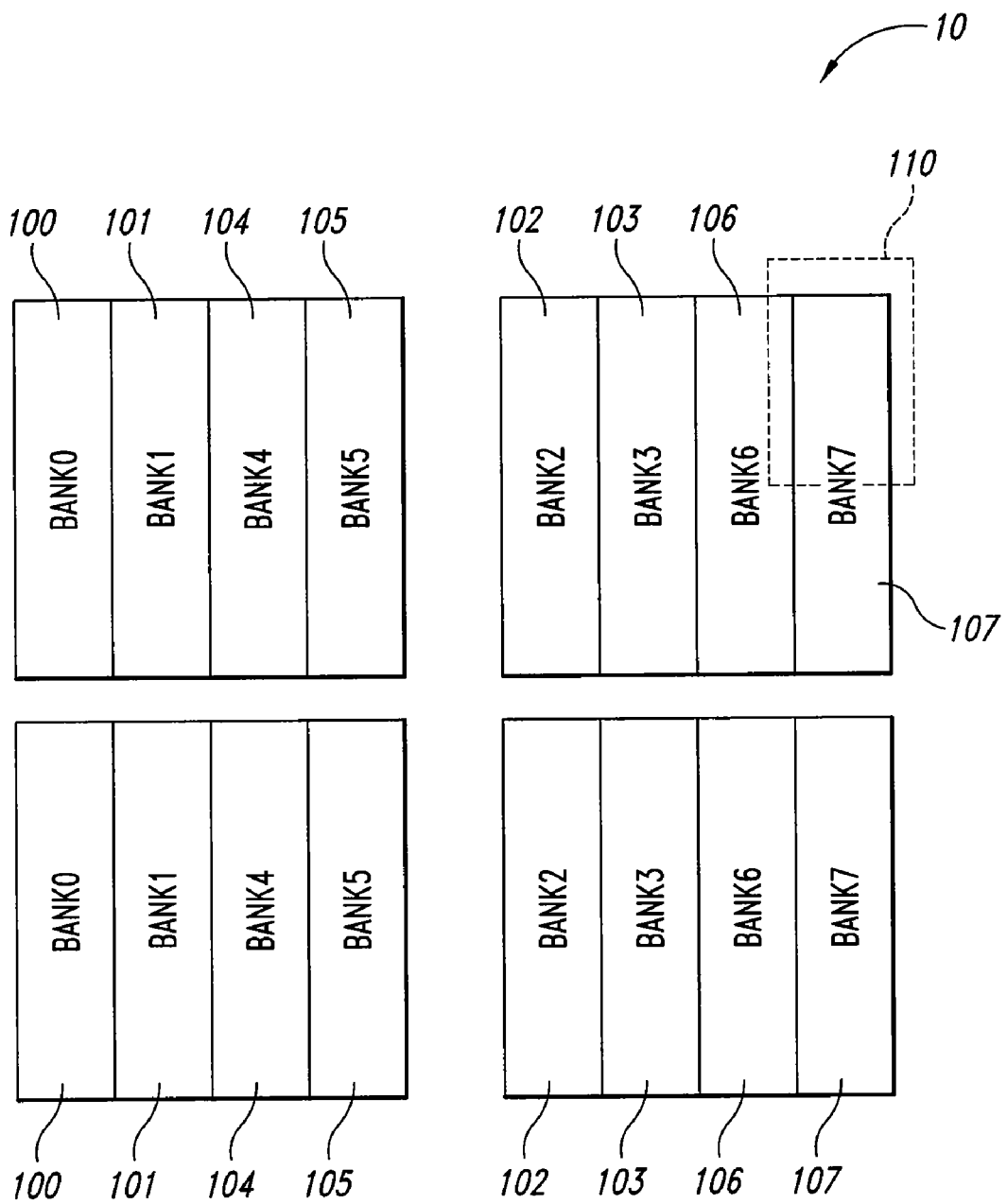
FIG. 1 is a simplified block diagram of a multi-bank arrangement of a memory array.
Figure 2:
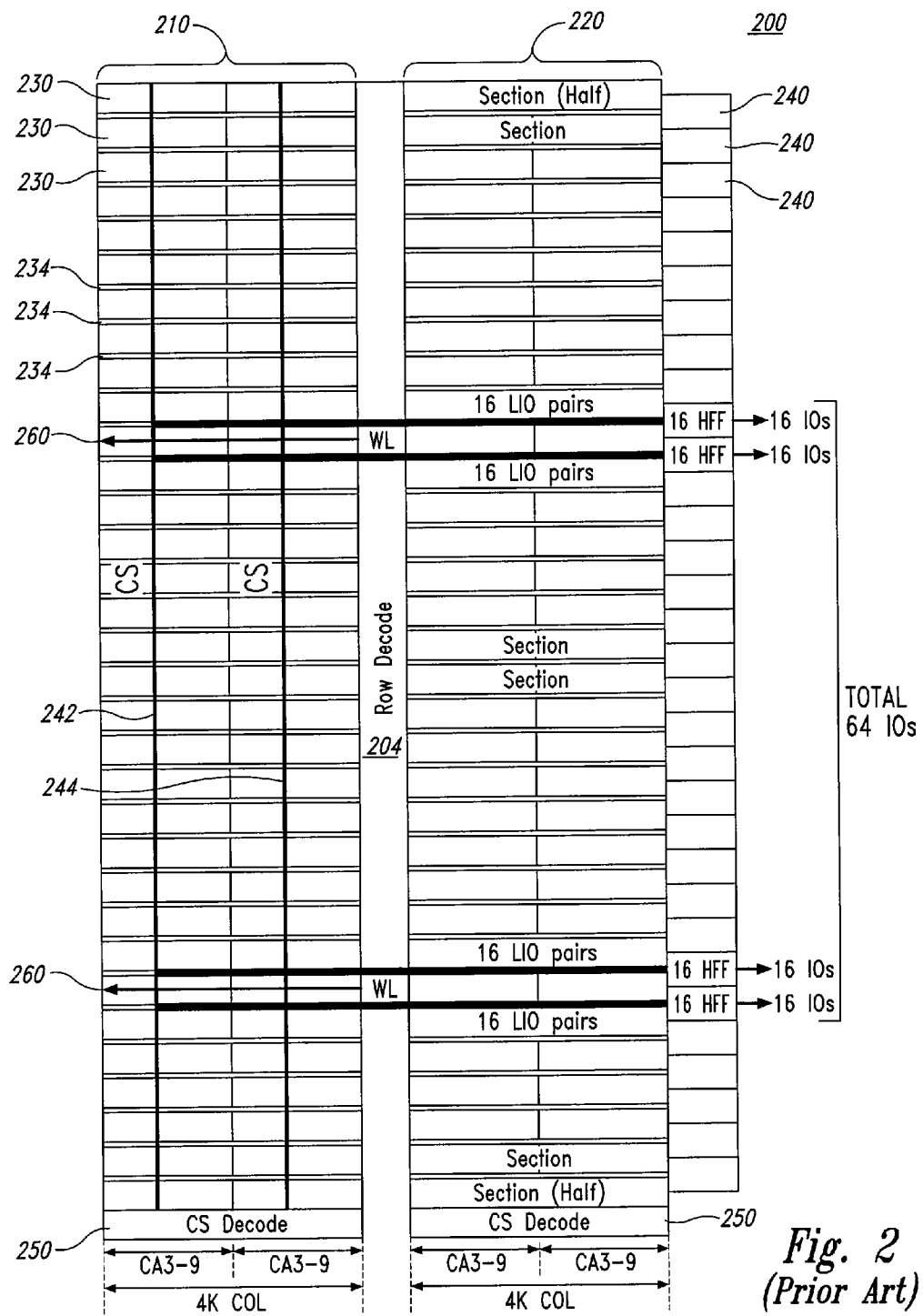
FIG. 2 is a simplified block diagram of an array of memory cells representing a portion of the multi-bank arrangement of FIG. 1.
Figure 4:
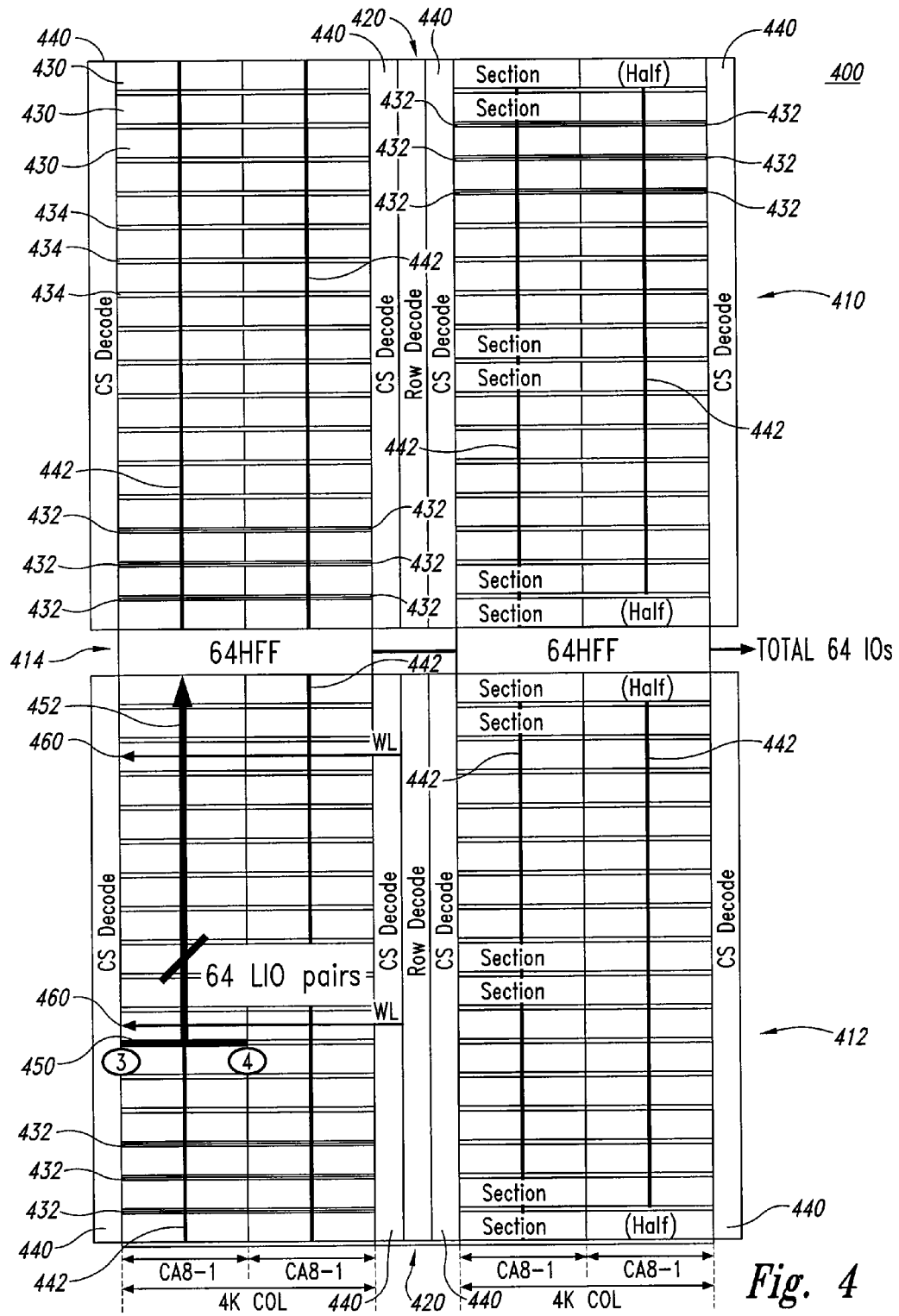
FIG. 4 is a simplified block diagram of an array of memory cells according to an embodiment of the present invention.

FIG. 1 is a simplified block diagram of an arrangement of memory banks for a memory cell array 10. Eight banks of memory 100-107 are shown. Each bank of memory 100-107 includes a first half and a second half (positioned in FIG. 1 as an upper-half and a lower-half). Although the arrangement illustrated in FIG. 1 is not associated with a particular size of memory, an example size for the memory array 10 is four gigabits, with each of the memory banks 100-107 including 512 megabits (256 Mbits per half-bank). Alternative embodiments of the invention have different sized memory arrays. The particular size has been provided by way of example, and is not intended to limit the present invention to any particular memory capacity. FIG. 1 further illustrates a quarter-bank portion 110 identified by a dashed rectangle. FIGS. 2 and 4 illustrate a more detailed arrangement for the quarter-bank portion 110.

FIG. 2 illustrates a simplified block diagram of a portion of a prior art memory array. As previously discussed, the portion illustrated in FIG. 2 represents a quarter of a memory bank 100-107 illustrated in FIG. 1, and will be referred to as a "quarter-bank" 200. The block diagram of FIG. 2 represents a general arrangement of memory cells and related circuits, as known by those ordinarily skilled in the art.

In the present example, the quarter-bank 200 is separated into two halves 210, 220 separated by a region 204 in which row decoders are generally located. The row decoders are conventional. Each half 210, 220 is divided into 33 sections 230 that are separated by a respective sense amplifier region 234. Each section 230 is logically (by column address) divided into two sub-sections. Memory cells are arranged in rows and columns of memory cells (not shown) in the sections 230 and conventional sense amplifiers coupled to respective columns of memory are generally located in the sense amplifier regions 234. The rows of memory cells are represented by word lines (not shown), as known. Although not shown, the word lines of the quarter-bank 200 are arranged parallel to the sense amplifier regions 234 and the columns are arranged perpendicular to the sense amplifier regions 234. In the arrangement of FIG. 2, the columns of memory of a section 230 are coupled to one of two sets of sense amplifiers, with each set located in the sense amplifier regions 234 adjacent the section. In a particular example, each of the sections 230 include 2M of memory cells arranged as 512 rows by 4,096 (4K) columns of memory cells (note that of the 33 sections in each half 210, 220, 31 sections have 4,096 columns while the remaining two sections have half the number of columns, that is, 2,048). In this example, the quarter-bank 200 has a capacity of 128 Mbits of data.

Associated with the quarter-bank 200 are 32 sets of "helper flip-flops" ("HFFs") 240. As known, the HFFs latch data output by accessed memory cells. In the present example, each set of HFFs 240 includes 16 HFFs for a total of 512 HFFs for the quarter-bank 200. The 16 HFFs of a respective set of HFFs 240 are coupled to the columns of memory of two sections 230 (one section from half 210 and another section from half 220) by local input-output ("LIO") lines that generally extend across the two halves 210, 220 in a respective sense amplifier region 234. The LIO lines will be referred to as "pairs" in FIG. 2 because LIO lines are typically implemented using pairs of complementary signal lines. Column select ("CS") gates (not shown) are used to selectively couple respective columns of memory (by coupling the respective sense amplifiers) to the LIO pairs. Particular CS gates are activated by respective CS lines that extend the length of the halves 210, 220. The activated CS gates couple the data from selected sense amplifiers to a respective set of HFFs. Two CS lines 242, 244 are illustrated in FIG. 2, and will be used to describe operation of the quarter-bank 200. However, it will be appreciated that many CS lines are present, but not shown in FIG. 2. Particular CS lines are selected by CS decoders 250 to couple the columns of memory corresponding to a memory address to the respective LIO pairs, and in turn, to the respective sets of HFFs 240.

Although operation of the quarter-block 200 is known by those ordinarily skilled in the art, a brief example of operation is provided. When accessing memory cells of the quarter-block 200 corresponding to a requested memory address, the memory addresses are decoded so that the row decoder activates two word lines (i.e., two rows of memory cells) (represented in FIG. 2 as word lines 260) from two different sections 230. As known, the memory cells at the intersection of the activated word lines and the columns of memory for the two sections 230 are coupled to respective sense amplifiers. As previously discussed, the sense amplifiers to which the columns of a section are coupled are located in the sense amplifier regions 234 adjacent the sections having the activated word lines 260. CS lines corresponding to the requested memory address are driven by the CS decoders 250 to activate CS gates coupling particular columns to the LIO pairs. In the present example, the 16 LIO pairs associated with the sense amplifier regions 234 adjacent the sections 230 having the activated word lines 260 are coupled to 16 respective columns in the sections 230. That is, the CS line 242 activates 32 CS gates to couple 32 columns (eight columns per adjacent sense amplifier regions 234) and the CS line 244 activates 32 CS gates to couple another 32 columns (eight columns per adjacent sense amplifier regions 234) to the respective LIO pairs. A total of 64 columns are coupled to respective 64 LIO pairs to be provided to four respective sets of HFFs 240. As a result, data from the 64 different memory cells are coupled to respective HFFs.

Figure 3:
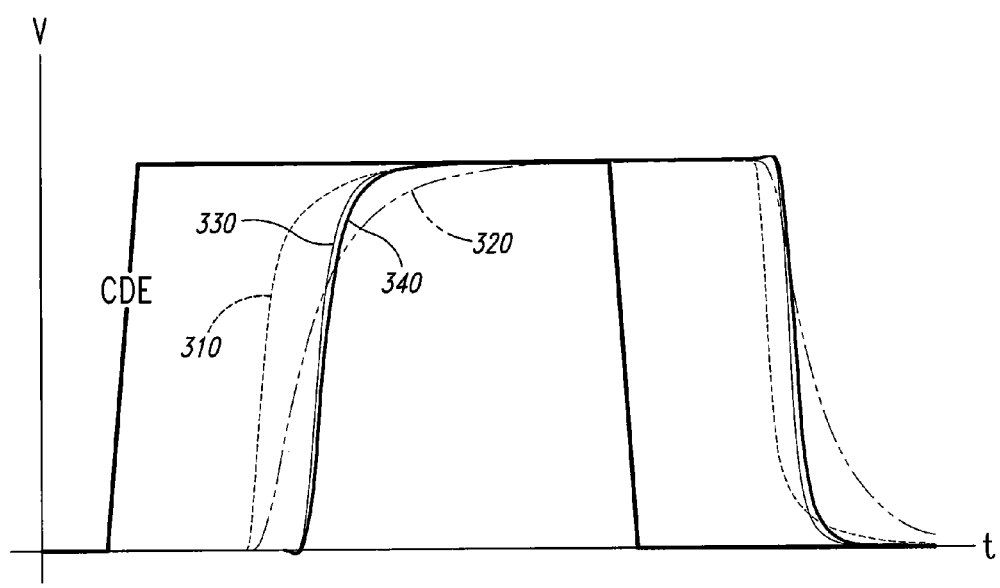
FIG. 3 is a signal diagram illustrating examples of signal responses on column select lines of FIGS. 2 and 4.

As previously discussed, the CS lines of the quarter-block 200 extend the length of the halves 210, 220 over 33 sections 230 and are coupled to respective CS gates in each of the 32 sense amplifier regions 234. Generally, the CS lines are arranged perpendicular to word lines and parallel to columns. Each of the CS lines are coupled to 256 CS gates (8 gates per sense amplifier region×32 sense amplifier regions) over its length. The physical length of each CS line, as well as the coupling to the CS gates over its length, causes each CS line to be heavily electrically loaded. As a result, the response of a signal propagated over a CS line is different from one end to the opposite end. FIG. 3 illustrates examples of signal responses 310, 320 for a signal driven on a CS line in response to a column decoder enable signal CDE. The signal response 310 is for the signal driven on a CS line near a CS driver (not shown) such as that included in the CS decoder 250 and the signal response 320 is for the signal at the opposite end of the CS line. The signal response 310 exhibits a sharp slope whereas the signal response 320 exhibits a shallower slope due to the electrical loading over the CS line. The difference in signal response results in a timing delay from one end of a CS line to the other end. As a result, the difference in signal response leads to difficulty in controlling the timing of enabling and disabling CS gates and the sets of HFFs 240. That is, the sets of HFFs 240 associated with the sense amplifier regions 234 located at the distant end of the CS lines (furthest away from the CS drivers) cannot be enabled as early as those sets of HFFs 240 located at the near end of the CS lines (closest to the respective CS driver) because of the lag in activating the CS gates at the distant end. Moreover, the difference in signal response from one end of the CS line to the other can be exacerbated by process variations that occur during manufacture of the memory array, as well as variations in operating conditions, such as changes in temperature and voltage. As a result, the timing of enabling and disabling the CS gates and the HFFs 240 is based on the worst case scenario, which results in a slower timing, and consequently, slower memory performance.

FIG. 4 is a simplified block diagram of a portion of an array of memory according to an embodiment of the present invention. The portion illustrated in FIG. 4 represents a quarter of a memory bank 100-107 illustrated in FIG. 1, and will be referred to as a "quarter-bank" 400. The block diagram of FIG. 4 represents a general arrangement of memory cells and related circuits, as known by those ordinarily skilled in the art. It will also be appreciated by those ordinarily skilled in the art that the particular sizes, logical and physical arrangement of memory sections and sub-sections, or portion of the memory arrays illustrated in and described with reference to FIG. 4 are not intended to limit the scope of the present invention to any particular embodiment described herein, but have been provided merely as examples.

The quarter-bank 400 includes first and second portions 410, 412 that are separated by a region 414 in which a plurality of HFFs are located. In one embodiment, two sets of 64 HFFs are located in the region 414, for a total of 128 HFFs associated with the quarter-bank 400. Each of the portions 410 (upper), 412 (lower) includes two groups (left and right) of memory sections 430. The groups of the first and second portions 410, 412 are separated by a region 420. The memory sections 430 are separated by sense amplifier regions 434 in which sense amplifiers for the sections are located. Row decoders are located in the region 420. The sections 430 are logically divided into sub-sections, and CS decoders 440 are coupled to CS lines 432 of the sub-sections. Memory cells are arranged in rows, which are represented by word lines (not shown) and columns (not shown) in the sections 430, and the sense amplifiers of the sense amplifier regions 434 are coupled to respective columns of memory. In one embodiment, the quarter-bank 400 represents 128M memory cells arranged in 68 sections 430. Each section 430 includes 2M of memory cells arranged as 512 rows by 4,096 (4K) columns of memory cells (note 60 of the sections have 4,096 columns while the eight remaining sections 430 have half the number of columns, that is, 2,048).

As previously discussed, the CS lines for the quarter-bank 200 extend the length of the length of the halves 210, 220 of the quarter-bank and are arranged perpendicular to the sense amplifier regions 234. In contrast to the quarter-bank 200, the quarter-bank 400 includes CS lines 432 that extend along the length of the sections 430, generally in the sense amplifier regions 434. The CS lines 432 are coupled to CS gates which are used to selectively couple sense amplifiers (i.e., columns of memory) to LIO pairs 442. The CS gates can be located in the sense amplifier regions 434. In the particular embodiment illustrated in FIG. 4, the CS lines 432 correspond to a sub-section (generally one-half of a section 430) and are decoded by one of the CS decoders 440 associated with the group of memory sections 430.

The quarter-bank 400 includes sets of LIO pairs 442 that traverse the groups of memory sections 430 of the portions 410, 412 and are selectively coupled to one of the sets of HFFs in the region 414. The LIO pairs of the quarter-bank 200 extend the length of the memory sections 234 of the halves 210, 220 in the sense amplifier regions 234, and are coupled to a respective set of 16 HFFs 240. In the embodiment illustrated in FIG. 4, 17 sub-sections of a group of memory sections share 64 LIO pairs 442, resulting in two sets of 64 LIO pairs 442 traversing the sections 430 of a group of memory sections and a total of eight sets of 64 LIO pairs 442 for the quarter-bank 400.

FIG. 4 illustrates an activated set of CS lines 450 and associated LIO pairs 452 coupling 64 bits of data from 64 columns of memory of a section 430 to the HFFs. It will be appreciated by those ordinarily skilled in the art, however, that the quarter-bank 400 includes many CS lines for activating CS gates that couple columns of memory of the sections 430 to an associated set of LIO pairs.

Operation of the quarter-bank 400 is similar to operation of the quarter-bank 200, except that the coupling of data from requested columns of memory to the HFFs to provide 64 bits of data utilize CS lines 432 and LIO pairs 442 that are arranged differently than in the quarter-bank 200, as will be explained in more detail below. Generally, the CS lines 432 are arranged parallel to word lines and perpendicular to columns of the memory sections 430. The LIO pairs 442 are generally arranged perpendicular to word lines and parallel to columns of memory sections 430.

In operation, when accessing memory cells of the quarter-block 400 corresponding to a requested memory address, the memory addresses are decoded so that the row decoder activates two word lines (i.e., two rows of memory cells) (represented in FIG. 4 as word lines 460) from two different sections 430. As known, the memory cells at the intersection of the activated word lines and the columns of memory for the two sections 430 are coupled to respective sense amplifiers. As previously discussed, the sense amplifiers to which the columns of a section are coupled are located in one of the sense amplifier regions 434 adjacent the sections having the activated word lines 460. CS lines 432 corresponding to the requested memory address are selected by the CS decoders 440 to activate CS gates to couple particular columns to the LIO pairs 442 (highlighted LIO pairs 452 represent the LIO pairs associated with the access operation). In the present example, data from 64 columns of memory of one section 430 are coupled to the 64 HFFs through the LIO pairs 452. For a read operation, the 64 HFFs output 64 bits of data.

The arrangement of CS lines 432 according to embodiments of the present invention result in physically shorter signal lines in comparison to the arrangement of CS lines for the quarter-bank 200 of FIG. 2. The shorter signal lines have less electrical loading, and consequently, there is less difference between the signal response from one end of the CS lines 432 to the other. FIG. 3 illustrates examples of signal responses 330, 340 for a signal driven on a CS line 432 in response to a column decoder enable signal CDE. The signal response 330 is for the signal driven on a CS line 432 near a CS driver (not shown) such as that included in the CS decoder 440 and the signal response 340 is for the signal at the opposite end of the CS line 432.

The signal responses 330, 340 exhibit sharp slopes with little difference in timing and response between the two ends of the CS line 432. With less difference between the near-end and far-end signal response, enable and disable timing for CS gates and HFFs can be more accurately controlled and adjusted. Additionally, for the arrangement described with reference to FIG. 4, power consumption for the case of random access to memory cells is less compared to the arrangement of the quarter-bank 200 because fewer sets of sense amplifiers are activated to obtain output data. For example, as previously discussed with reference to the quarter-bank 200, 64 bits of data are obtained during a read operation data from several sets of sense amplifiers (i.e., four sets of sense amplifiers×16 bits per set) whereas 64 bits of data are obtained during a read operation from one set of sense amplifiers for the quarter-bank 400.

The arrangement of CS lines 430 previously discussed allows for use of common LIO pairs 442 to couple sense amplifiers to the HFFs. That is, a set of LIO pairs 442 are shared by the sub-sections of a group of sections 430. The CS lines 430 are selected by CS decoders to activate CS gates to couple the sense amplifiers to the LIO pairs. The LIO pairs of the quarter-bank 200, in contrast, are shared by the two sections 230 from the two halves 210, 220. A benefit to the common LIO pairs 442 is that the number of HFFs for the quarter-bank is less than for the prior art quarter-bank 200 arrangement. In the embodiment providing 64 bits of data for a read operation, 128 HFFs are included with the quarter-bank 400. In contrast, the quarter-bank 200 includes 512 HFFs to provide 64 bits of data.

The embodiment described with reference to FIG. 4 has been described as providing 64 bits of data during a read operation. It will be appreciated, however, that other embodiments of the present invention can provide a different number of bits of data during a read operation. For example, an array of memory according to an alternative embodiment of the present invention can provide 16 bits of data during a read operation. Other examples include providing 32 bits and 128 bits of data during read operations. The specific number of bits of data, CS lines, and LIO pairs previously described have been provided by way of example, and are not intended to limit the scope of the invention to the particular numbers.

Additionally, the arrangement of CS lines 430 and LIO pairs 442 previously described allow for alternative semiconductor structural designs. For example, in the arrangement of CS lines and LIO pairs described with reference to the quarter-bank 400, the LIO pairs can be formed from a conductive layer that is formed later in the fabrication process than the conductive layer from which the CS lines are formed. Benefits can result from the use of greater line pitches for signal lines formed from later conductive layers.

Figure 5:
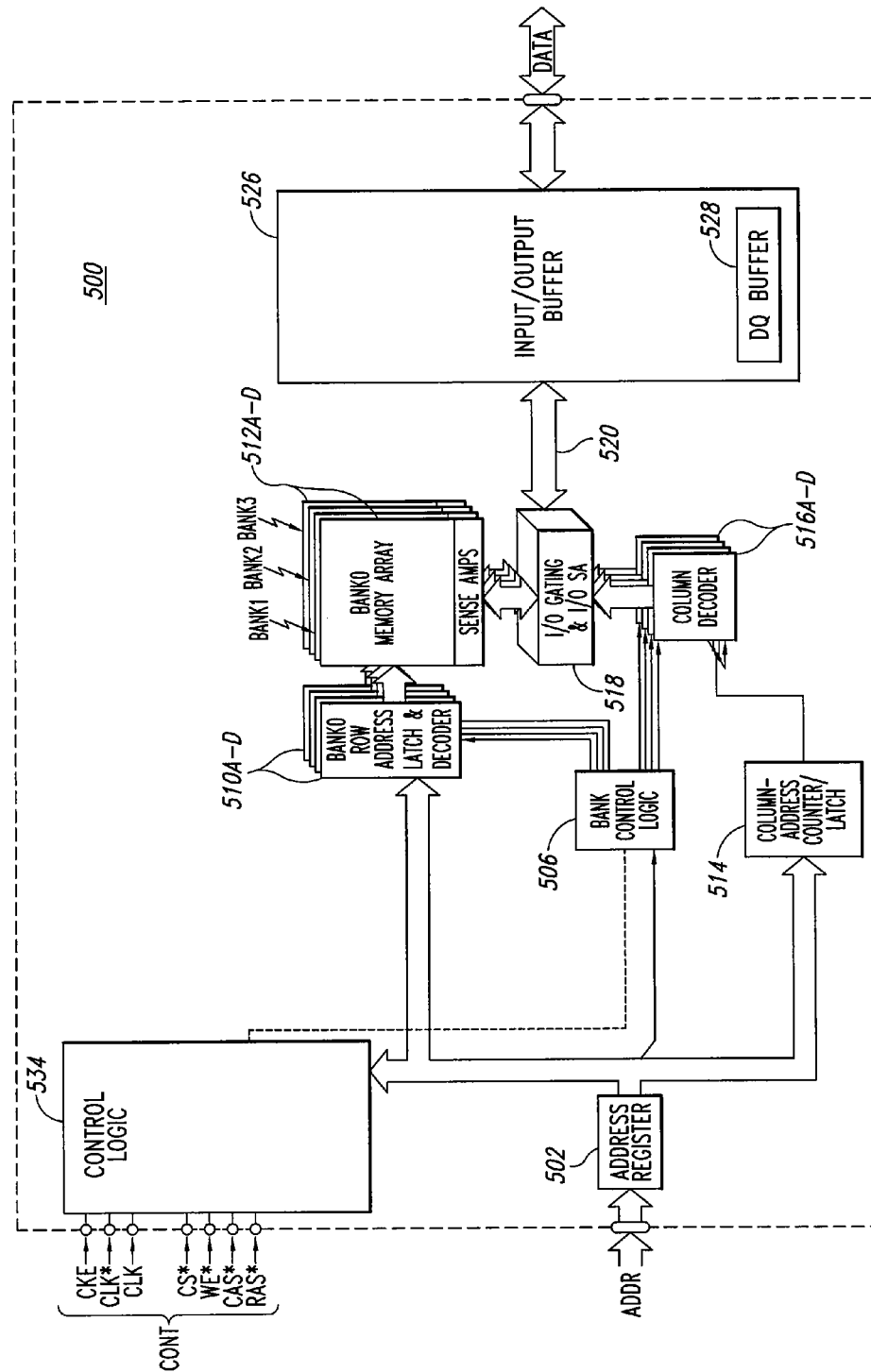
FIG. 5 is a block diagram of a memory system including an embodiment of the present invention.

FIG. 5 is a functional block diagram of a memory system 500 that includes arrays of memory having an arrangement according to an embodiment of the present invention. The memory system 500 in FIG. 5 will be described as a synchronous dynamic random access memory (SDRAM), although principles described herein are applicable to any array of memory included in a memory system. For example, the clock enable signal CKE enables clocking of the command decoder 534 by the clock signals CLK, CLK* to latch and decode an applied command, and generate a sequence of internal clocking and control signals that control various components of the memory system 500 to execute the function of the applied command. When enabled by the CKE signal, the input/output buffer transfers data from and into the memory system 500 for read and write operations, respectively, in response to the CLK, CLK* signals. For example, the clock enable signal CKE enables clocking of the command decoder 534 by the clock signals CLK, CLK* to latch and decode an applied command, and generate a sequence of internal clocking and control signals that control various components of the memory system 500 to execute the function of the applied command. When enabled by the CKE signal, an input/output buffer 526 transfers data from and into the memory system 500 for read and write operations, respectively, in response to the CLK, CLK* signals.

A control logic and command decoder 534 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read or a write command. The clock enable signal CKE enables operation of the memory system 500 according to the CLK, CLK* signals.

The memory system 500 further includes an address register 502 that receives row, column, and bank addresses over an address bus ADDR, with the a memory controller (not shown) typically supplying the addresses. The address register 502 receives a row address and a bank address that are applied to a row address latch and decoder and bank control logic circuit 506, respectively. The bank control logic 506 activates the row address latch and decoder 510A-D corresponding to either the bank address received from the address register 502, and the activated row address latch and decoder latches and decodes the received row address. In response to the decoded row address, the activated row address latch and decoder 510A-D applies various signals to a corresponding memory bank 512A-D to thereby activate a row of memory cells corresponding to the decoded row address. Each memory bank 512A-D includes a memory-cell array having a plurality of memory cells arranged in rows and columns, and the data stored in the memory cells in the activated row is stored in sense amplifiers in the corresponding memory bank. At least one memory bank 512A-D includes an array of memory having an arrangement according to an embodiment of the invention.

A column address is also applied on the ADDR bus after the row and bank addresses, and the address register 502 applies the column address to a column address counter and latch 514 which, in turn, latches the column address and applies the latched column address to a plurality of column decoders 516A-D. The bank control logic 506 activates the column decoder 516A-D corresponding to the received bank address, and the activated column decoder decodes the applied column address. In response to the column address from the counter and latch 514, the activated column decoder 516A-D applies decode and control signals to an I/O gating circuit 518 which, in turn, accesses memory cells corresponding to the decoded column address in the activated row of memory cells in the memory bank 512A-D being accessed.

In operation, during data read operations, data being read from the addressed memory cells are coupled through the I/O gating and sense amplifier circuit 518 and a data path 520 to an input/output buffer 526. The input/output buffer 526 latches data in a DQ buffer 528 and provides data from the memory system 500 onto a data bus DATA in accordance with the CLK, CLK* signals when the memory system 500 is enabled by the CKE signal. The I/O gating and I/O sense amplifier circuit 518 drive data signals onto the data path 520 to the DQ buffer 528 included in the input/output buffer 526. The input/output line sense amplifiers can be tailored to have different output drive capacities, as previously discussed. During data write operations, an external circuit such as a memory controller (not shown) applies data to the data bus DATA which are clocked into the input/output buffer 526 in accordance with the CLK, CLK* signals. The data are then provided to the memory array through the data path 520 and the I/O gating and I/O sense amplifier circuit 518 to be stored by memory cells in the memory bank 512A-D that correspond to the row, column, and bank addresses.

Figure 6:
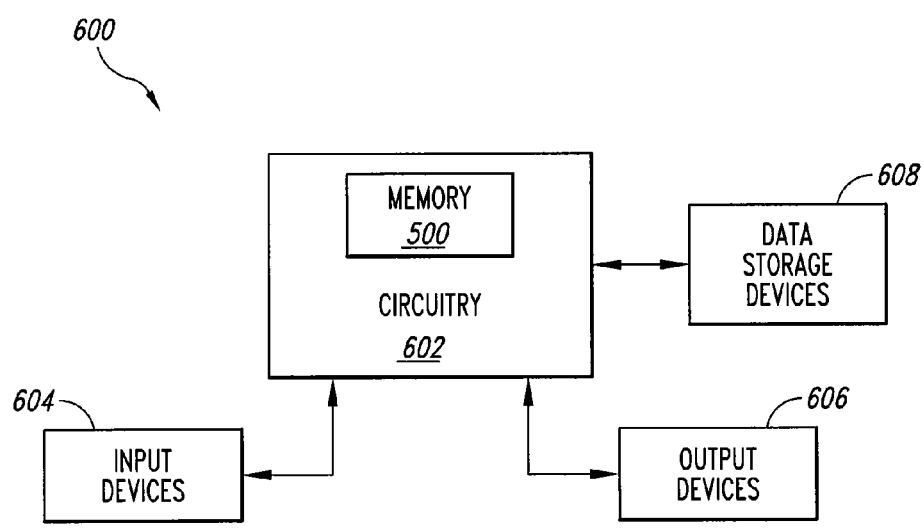
FIG. 6 is a functional block diagram illustrating a processor-based system including the synchronous memory device of FIG. 5.

FIG. 6 is a block diagram of a processor-based system 600 including processor circuitry 602, which includes the memory system 500 of FIG. 5. Typically, the processor circuitry 602 is coupled through address, data, and control buses to the memory system 500 to provide for writing data to and reading data from the memory device. The processor circuitry 602 includes circuitry for performing various processing functions, such as executing specific software to perform specific calculations or tasks. In addition, the processor-based system 600 includes one or more input devices 604, such as a keyboard or a mouse, coupled to the processor circuitry 602 to allow an operator to interface with the processor-based system 600. Typically, the processor-based system 600 also includes one or more output devices 606 coupled to the processor circuitry 602, such as output devices typically including a printer and a video terminal. One or more data storage devices 608 are also typically coupled to the processor circuitry 602 to store data or retrieve data from external storage media (not shown). Examples of typical storage devices 608 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An array of memory cells, comprising:
a plurality of sections of memory, each section of memory having first and second sub-sections of memory, each sub-section of memory having a plurality of memory cells arranged in rows and columns of memory;
a plurality of regions disposed between the plurality of sections of memory, each region having a first portion adjacent the first sub-sections of memory and a second portion adjacent the second sub-sections of memory;
a plurality of sense amplifiers located in each of the plurality of regions, each sense amplifier coupled to a respective column of memory;
a plurality of column select switches coupled to the plurality of sense amplifiers and configured to conduct current when activated;
a plurality of column select lines located in the first or second portions of each of the plurality of regions, each column select line located in the first portion of a region associated with the first sub-sections of memory and each column select line located in the second portion of a region associated with the second sub-sections of memory, each column select line coupled to a group of column select switches to activate the respective column select switches;
a first column select line decoder coupled to the column select lines associated with the first sub-sections of memory and configured to selectively activate the column select switches coupled to column select lines located in the first portion of at least one of the regions; and
a second column select line decoder coupled to the column select lines associated with the second sub-sections of memory and configured to selectively activate the column select switches coupled to column select lines located in the second portion of at least one of the regions.

2. The array of memory cells of claim 1 wherein the rows of memory for each section are represented by word lines and the column select lines are arranged in the plurality of regions parallel to the word lines.

3. The array of memory cells of claim 1 wherein sets of column select switches are located in a respective region, and the array of memory cells further comprises a plurality of sets of local input-output lines, each set of local input-output lines coupled to column select switches of a plurality of different regions.

4. The array of memory cells of claim 3 wherein the rows of memory for each section are represented by word lines and the sets of local input-output lines are arranged perpendicular to the word lines.

5. The array of memory cells of claim 3, further comprises a plurality of sets of flip-flops, each set coupled to more than one set of local input-output lines.

6. The array of memory cells of claim 3 wherein the plurality of column select lines located in a region are coupled to column select switches that are coupled to the same set of local input-output lines.

7. An array of memory cells, comprising:
a plurality of sections of memory, each section of memory having first and second sub-section of memory, each sub-section of memory having a plurality of memory cells arranged in rows and columns of memory;
a plurality of regions disposed between the plurality of sections of memory, each region having a first portion adjacent the first sub-sections of memory and a second portion adjacent the second sub-sections of memory;
a plurality of sense amplifiers located in the first portion of each of the plurality of regions and a plurality of sense amplifiers located in the second portion of each of the plurality of regions, each sense amplifier coupled to a respective column of memory;
a plurality of column select switches coupled to the plurality of sense amplifiers and configured to conduct current when activated, column select switches coupled to sense amplifiers located in the first portion of a region activated independently of column select switches coupled to sense amplifiers located in the second portion of the same region;
a plurality of sets of local input-output lines, each set of local input-output lines extending transversely to the plurality of regions and coupled to the column select switches coupled to the sense amplifiers located in one of the first and second portions of the regions that are coupled to the columns of memory of a plurality of sections of memory;
a first column select line decoder coupled to column select lines associated with the first sub-sections of memory and configured to selectively activate the column select lines located in the first portion of at least one of the regions; and
a second column select line decoder coupled to column select lines associated with the second sub-sections of memory and configured to selectively activate the column select lines located in the second portion of at least one of the regions.

8. The array of memory cells of claim 7, further comprising a plurality of sets of flip-flops coupled to the sets of local input-output lines, each set of flip-flops coupled to a plurality of sets of local input-output lines.

9. The array of memory cells of claim 7 wherein the rows of memory for each section are represented by word lines and the local input-output lines are arranged perpendicularly to the word lines.

10. The array of memory cells of claim 7, further comprising a plurality of column select lines located in each of the plurality of regions, each column select line coupled to a group of column select switches to activate the respective column select switches to be selectively coupled a respective set of local input-output lines.

11. The array of memory cells of claim 10 wherein the column select lines in each of the plurality of regions are arranged in the plurality of regions parallel to the word lines.

12. The array of memory cells of claim 10 wherein each column select line is coupled to a set of column select switches that are coupled to sense amplifiers located in the same region, each set of column select switches to which a column select line is coupled having a number of column select switches corresponding to the number of local input-output lines in a set of local input-output lines.

13. The array of memory cells of claim 12 wherein the plurality of column select lines comprises a plurality of sets of column select lines, each set of column select lines located in the same region.

14. A memory device, comprising:
an address bus;
a control bus;
an address decoder coupled to the address bus;
a control circuit coupled to the control bus;
input/output buffer circuits coupled to the data bus; and a memory-cell array coupled to the address decoder, control circuit, data bus, and input/output buffer circuits, the memory-cell array including an array of memory cells accessed in response to the address decoder decoding memory addresses corresponding to memory locations of the array of memory cells, the array of memory cells comprising:
   a plurality of sections of memory, each section of memory having first and second sub-sections of memory, each sub-section of memory having a plurality of memory cells arranged in rows and columns of memory;
   a plurality of regions disposed between the plurality of sections of memory, each region having a first portion adjacent the first sub-sections of memory and a second portion adjacent the second sub-sections of memory;
   a plurality of sense amplifiers located in each of the plurality of regions, each sense amplifier coupled to a respective column of memory;
   a plurality of column select switches coupled to the plurality of sense amplifiers and configured to conduct current when activated;
   a plurality of column select lines located in the first or second portions of each of the plurality of regions, each column select line located in the first portion of a region associated with the first sub-sections of memory and each column select line located in the second portion of a region associated with the second sub-sections of memory, each column select line coupled to a group of column select switches to activate the respective column select switches in response to the address decoder;
   a first a first column select line decoder coupled to the column select lines associated with the first sub-sections of memory and configured to selectively activate the column select switches coupled to column select lines located in the first portion of at least one of the regions; and
   a second column select line decoder coupled to the column select lines associated with the second sub-sections of memory and configured to selectively activate the column select switches coupled to column select lines located in the second portion of at least one of the regions.

15. The memory device of claim 14 wherein the rows of memory for each section of the array of memory cells are represented by word lines and the column select lines are arranged in the plurality of regions parallel to the word lines.

16. The memory device of claim 14 wherein sets of column select switches of the array of memory cells are located in a respective region, and the array of memory cells further comprises a plurality of sets of local input-output lines, each set of local input-output lines coupled to column select switches of a plurality of different regions.

17. The memory device of claim 16 wherein the rows of memory for each section of the array of memory cells are represented by word lines and the sets of local input-output lines are arranged perpendicular to the word lines.

18. The memory device of claim 16 wherein the array of memory cells further comprises a plurality of sets of flip-flops, each set coupled to more than one set of local input-output lines.

19. The memory device of claim 16 wherein the plurality of column select lines located in a region of the array of memory cells are coupled to column select switches that are coupled to the same set of local input-output lines.

20. A processor-based system, comprising:
   a data input device;
   a data output device;
   a processor coupled to the data input and output devices;
   a memory controller coupled to the processor and operable to generate memory control and address signals for performing memory operations, including read operations; and
   a memory device coupled to the processor and operable to perform memory operations in response to the memory control signals, the memory device comprising:
      an address bus;
      a control bus;
      an address decoder coupled to the address bus;
      a control circuit coupled to the control bus;
      input/output buffer circuits coupled to the data bus; and
      a memory-cell array coupled to the address decoder, control circuit, data bus, and input/output buffer circuits, the memory-cell array including an array of memory cells accessed in response to the address decoder decoding memory addresses corresponding to memory locations of the array of memory cells, the array of memory cells comprising:
         a plurality of sections of memory, each section of memory having a plurality of memory cells arranged in rows and columns of memory;
         a plurality of regions disposed between the plurality of sections of memory;
         a plurality of sense amplifiers located in each of the plurality of regions, each sense amplifier coupled to a respective column of memory;
         a plurality of column select switches coupled to the plurality of sense amplifiers and configured to conduct current when activated; and
         a plurality of column select lines located in each of the plurality of regions, each column select line coupled to a group of column select switches to activate the respective column select switches in response to the address decoder.

21. The processor-based system of claim 20 wherein the rows of memory for each section of the array of memory cells are represented by word lines and the column select lines are arranged in the plurality of regions parallel to the word lines.

22. The processor-based system of claim 20 wherein each section of memory of the array of memory cells comprises first and second sub-sections of memory and each column select line is coupled to a group of column select switches that are coupled to sense amplifiers coupled to columns of memory located in the same sub-section of memory.

23. The processor-based system of claim 20 wherein sets of column select switches of the array of memory cells are located in a respective region, and the array of memory cells further comprises a plurality of sets of local input-output lines, each set of local input-output lines coupled to column select switches of a plurality of different regions.

24. The processor-based system of claim 23 wherein the rows of memory for each section of the array of memory cells are represented by word lines and the sets of local input-output lines are arranged perpendicular to the word lines.

25. The processor-based system of claim 23 wherein the array of memory cells further comprises a plurality of sets of flip-flops, each set coupled to more than one set of local input-output lines.

26. The processor-based system of claim 23 wherein the plurality of column select lines located in a region of the array of memory cells are coupled to column select switches that are coupled to the same set of local input-output lines.

* * * * *

UNITED STATES PATENT AND TRADEMARK OFFICE
CERTIFICATE OF CORRECTION

| | | |
|---|---|---|
| PATENT NO. | : 7,515,501 B2 | Page 1 of 1 |
| APPLICATION NO. | : 11/807272 | |
| DATED | : April 7, 2009 | |
| INVENTOR(S) | : Bessho et al. | |

It is certified that error appears in the above-identified patent and that said Letters Patent is hereby corrected as shown below:

In column 10, line 46, in Claim 10, after "coupled" insert -- to --.

In column 11, line 32, in Claim 14, after "a first" delete "a first". (Second Occurrence)

Signed and Sealed this

Thirtieth Day of June, 2009

JOHN DOLL
*Acting Director of the United States Patent and Trademark Office*